US006614297B2

United States Patent
Score et al.

(10) Patent No.: US 6,614,297 B2
(45) Date of Patent: Sep. 2, 2003

(54) MODULATION SCHEME FOR FILTERLESS SWITCHING AMPLIFIERS WITH REDUCED EMI

(75) Inventors: Michael D. Score, Richardson, TX (US); Paras M. Dagli, Richardson, TX (US); Roy C. Jones, III, Plano, TX (US); Wayne T. Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/900,396

(22) Filed: Jul. 6, 2001

(65) Prior Publication Data

US 2003/0006837 A1 Jan. 9, 2003

(51) Int. Cl.[7] .............................. H03F 3/38; H03F 3/217
(52) U.S. Cl. ...................... 330/10; 330/207 A; 330/251
(58) Field of Search ............................... 330/10, 207 A, 330/251

(56) References Cited

U.S. PATENT DOCUMENTS 3,900,823 A * 8/1975 Sokal et al. ................. 330/129
5,617,058 A * 4/1997 Adrian et al. ................. 330/10

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

A ternary modulation scheme for filterless switching amplifiers with reduced EMI reduces the common mode component of the signal by allowing only one state with zero differential voltage across the load to exist. The ternary modulation scheme is more efficient than the quaternary modulation scheme when applied to class-D filterless switching amplifiers since the gates of the power MOSFETs are being charged and discharged at only a small duty cycle instead of 50% duty cycle.

13 Claims, 5 Drawing Sheets

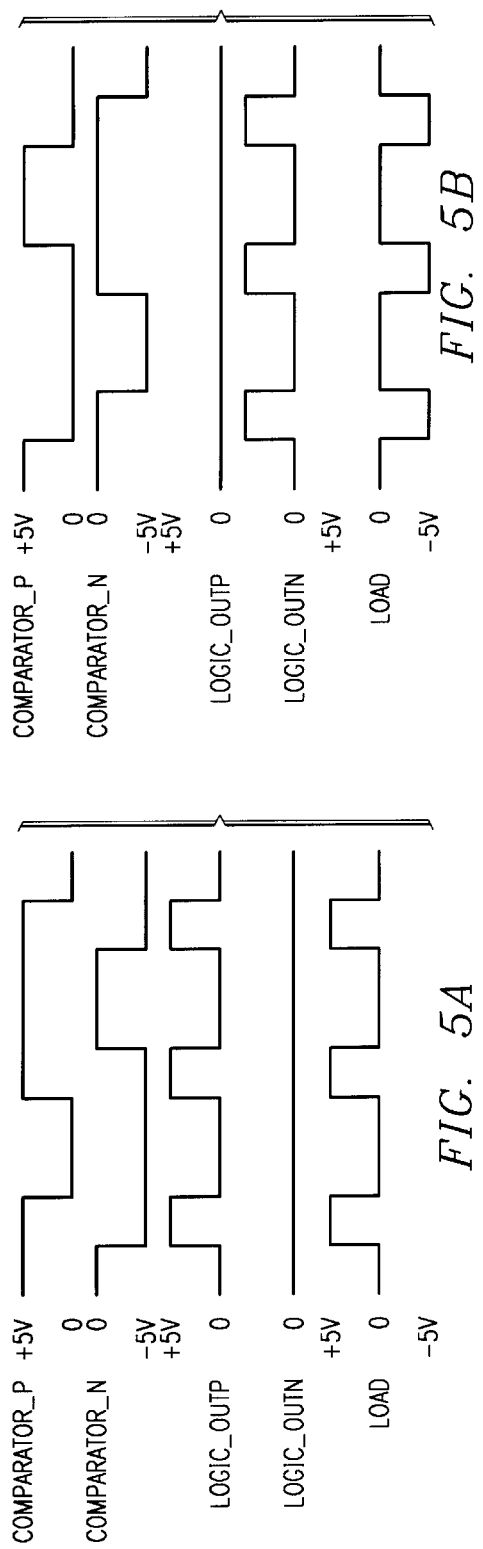
FIG. 5A
FIG. 5B
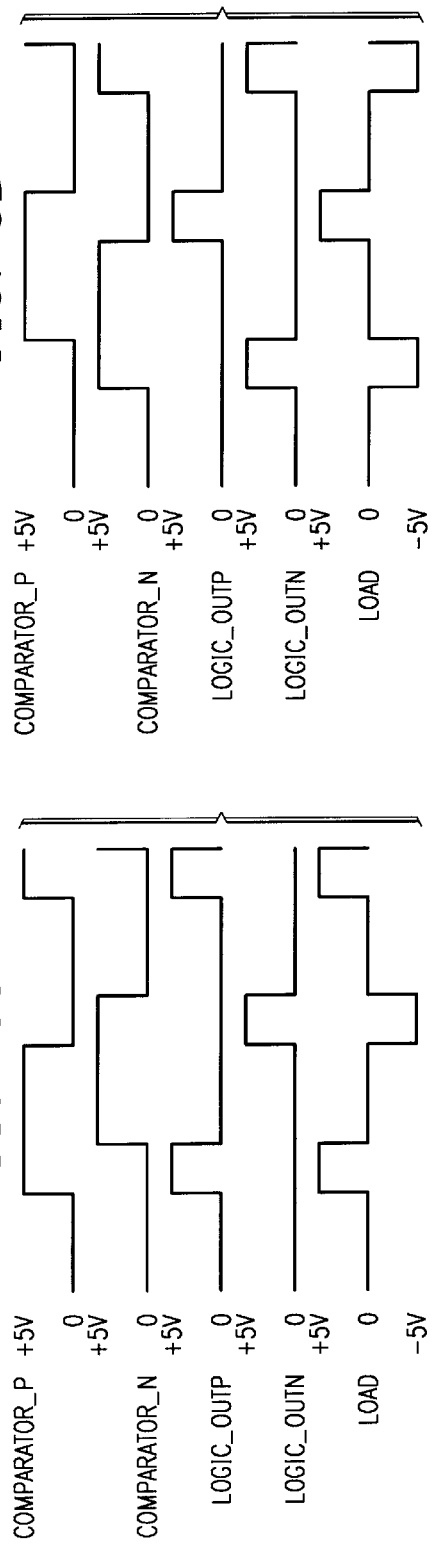
FIG. 5C
FIG. 5D

MODULATION SCHEME FOR FILTERLESS SWITCHING AMPLIFIERS WITH REDUCED EMI

BACKGROUND OF THE INVENTION

1. Field of the Invention

This invention relates generally to filterless amplifiers, and more particularly, to a filterless modulation scheme to reduce the total harmonic distortion (THD) and noise (N) associated with filterless amplifiers below that achievable using traditional modulation schemes.

2. Description of the Prior Art

Class-D amplifiers are two to five time more efficient than class-AB amplifiers. Because of their greater efficiency, class-D amplifiers require smaller power supplies and eliminate heat sinks, significantly reducing overall system costs, size and weight. Class-D amplifiers are not in many portable products today because the traditional class-D amplifier requires and output filter, which increases size by approximately 75% and solution cost by approximately 30%. Filterless class-D amplifiers eliminate the output filter while keeping the efficiency benefit. The filterless modulation scheme brings class-D amplifiers approximately equal to class-AB amplifiers in cost and size, by has the great efficiency advantages. The THD+N of the filterless modulation scheme is better than the THD+N of equivalent class-D amplifiers with the traditional modulation scheme.

A method to achieve filterless class-D operation, increased efficiency, and reduced cost is to deliver current to the load only when needed, and once delivered, maintain the current (try not to decay or waste energy in removing the current). A quaternary modulation scheme is implemented in an H-bridge configuration. FIG. 1 is a block diagram implementation of a quaternary modulation scheme that is familiar to those skilled in the art. The quaternary modulation scheme shown in FIG. 1 has four states of operation as shown in FIG. 2, and voltage and current waveforms as shown in FIG. 3. The modulation scheme uses any of the four states in any order, depending on the audio input signal.

When a positive audio signal is present, waveforms change to that shown in FIG. 3, wherein the edges of OUTP move away from each other, and the edges of OUTN move towards each other. The resulting differential signal across the bridge-tied-load consists of narrow pulses with polarity determined by the polarity of the audio input signal. These narrow pulses also have a secondary desired affect of doubling the differential pulse width modulation (PWM) frequency. This then achieves the desired effect of placing current into the load only when needed, resulting in increased efficiency and less energy loss in the load (speaker).

Eliminating the filter also causes the amplifier to radiate electromagnetic interference (EMI) from the wires connecting the amplifier to the speaker. EMI is defined as the radiation or transfer of electromagnetic energy through a non-metallic medium, such as air, that interferes with the operation of other electronic devices in the vicinity. An instantaneous change in current results in a magnetic (H) field, while an instantaneous change in a voltage results in an electric (E) field, both of which may cause EMI. The electric field, which is a common-mode effect, could in fact be quite large from the switching voltage if the speaker wires are long enough. A ferrite bead filter can be added to reduce the EMI radiation at 10 MHz and higher. The cut-off frequency, however, is limited because the inductance of the ferrite bead is limited due to size constraints and the capacitor is limited because the added capacitance increases the supply current and thus decreases the efficiency. The rail-to-rail common-mode voltage at 50% duty cycle causes an increase in supply current if the output of the amplifiers see too high of a capacitance.

In view of the foregoing, a need exists for a modulation scheme for filterless switching amplifiers with reduced EMI.

SUMMARY OF THE INVENTION

The present invention is directed to a ternary modulation scheme for filterless switching amplifiers with reduced EMI. The ternary modulation scheme reduces the common mode component of the signal via a logic block added between the output of comparators and the H-bridge described herein before with reference to FIG. 1. The logic block reduces the common mode component of the signal by allowing only one of the states with zero differential voltage across the load to exist. State 3 shown in FIG. 2, for example, is completely eliminated. Eliminating the common mode signal significantly reduces EMI since it reduces the electric field (E) which is responsible for EMI. The ternary modulation scheme thus reduces the possible number of states at the outputs to allow filterless operation while eliminating the switching of the common mode voltage at the modulation frequency.

In one aspect of the present invention, a ternary modulation scheme is provided to allow implementation of a class-D amplifier without the need for an output filter to achieve lower EMI than that achievable using the quaternary modulation scheme.

In another aspect of the present invention, a ternary modulation scheme is provided to reduce the possible number of states at the outputs and to eliminate switching of the common mode voltage at the modulation frequency.

In still another aspect of the present invention, a ternary modulation scheme is provided to reduce the cut-off frequency of a ferrite bead filter by reducing the size of the ferrite bead and increasing capacitance of the capacitor without increasing amplifier size or cost.

In yet another aspect of the present invention, a ternary modulation scheme is provided to reduce quiescent current when using an LC filter.

In still another aspect of the present invention, a ternary modulation scheme is provided to allow use of a smaller and less expensive LC filter without increasing the quiescent current or output ripple voltage for amplifiers that employ an LC filter.

According to one embodiment of the invention, a switching amplifier modulation circuit comprises:

a switching amplifier having a differential output; and a logic circuit operational to allow only one signal state with zero differential voltage across a load connected to the differential output to exist such that the common mode component of a differential signal across the load is substantially reduced below that achievable using modulation schemes that allow more than one signal state with zero differential voltage to exist across the load.

According to another embodiment of the invention, a switching amplifier modulation circuit comprises a logic circuit responsive to switching amplifier positive and negative logic signals generated in response to an audio input signal such that the logic circuit is operational to allow only one signal state with zero differential voltage across a load connected to a differential output associated with a switching amplifier to exist such that the common mode component of a differential signal across the load is substantially reduced below that achievable using modulation circuits that allow more than one signal state with zero differential voltage to exist across the load.

According to yet another embodiment of the invention, a switching amplifier modulation circuit comprises a switching amplifier having a differential output; and signal generating means for generating no more than one signal state with zero differential voltage across a load connected to the differential output to exist such that the common mode component of a differential signal across the load is substantially reduced below that achievable using modulation circuits that allow more than one signal state with zero differential voltage to exist across the load.

According to still another embodiment of the present invention, a switching amplifier modulation circuit comprises a differential amplifier responsive to an audio input signal to generate a differential amplifier output signal; a positive integrator responsive to the differential amplifier output signal to generate a positive integrator signal; a negative integrator responsive to the differential amplifier output signal to generate a negative integrator signal; a ramp generator operational to generate a ramp signal; a first comparator responsive to the ramp signal and the positive integrator signal to generate a first logic signal; a second comparator responsive to the ramp signal and the negative integrator signal to generate a second logic signal; an H-bridge circuit having a switching amplifier differential output; and a logic circuit responsive to the first and second logic signals to drive the H-bridge circuit such that the H-bridge circuit can generate a differential signal across a load connected to the switching amplifier differential output and wherein the logic circuit is operational to allow only one signal state with zero differential voltage across the load to exist such that the common mode component of the differential signal across the load is substantially reduced below that achievable using modulation schemes that allow more than one signal state with zero differential voltage to exist across the load.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 5 is a set of waveform timing diagrams illustrating voltage waveforms for four different cases where audio input is positive, negative and near zero crossings (going positive and negative) using the ternary modulation scheme shown in FIG. 4.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
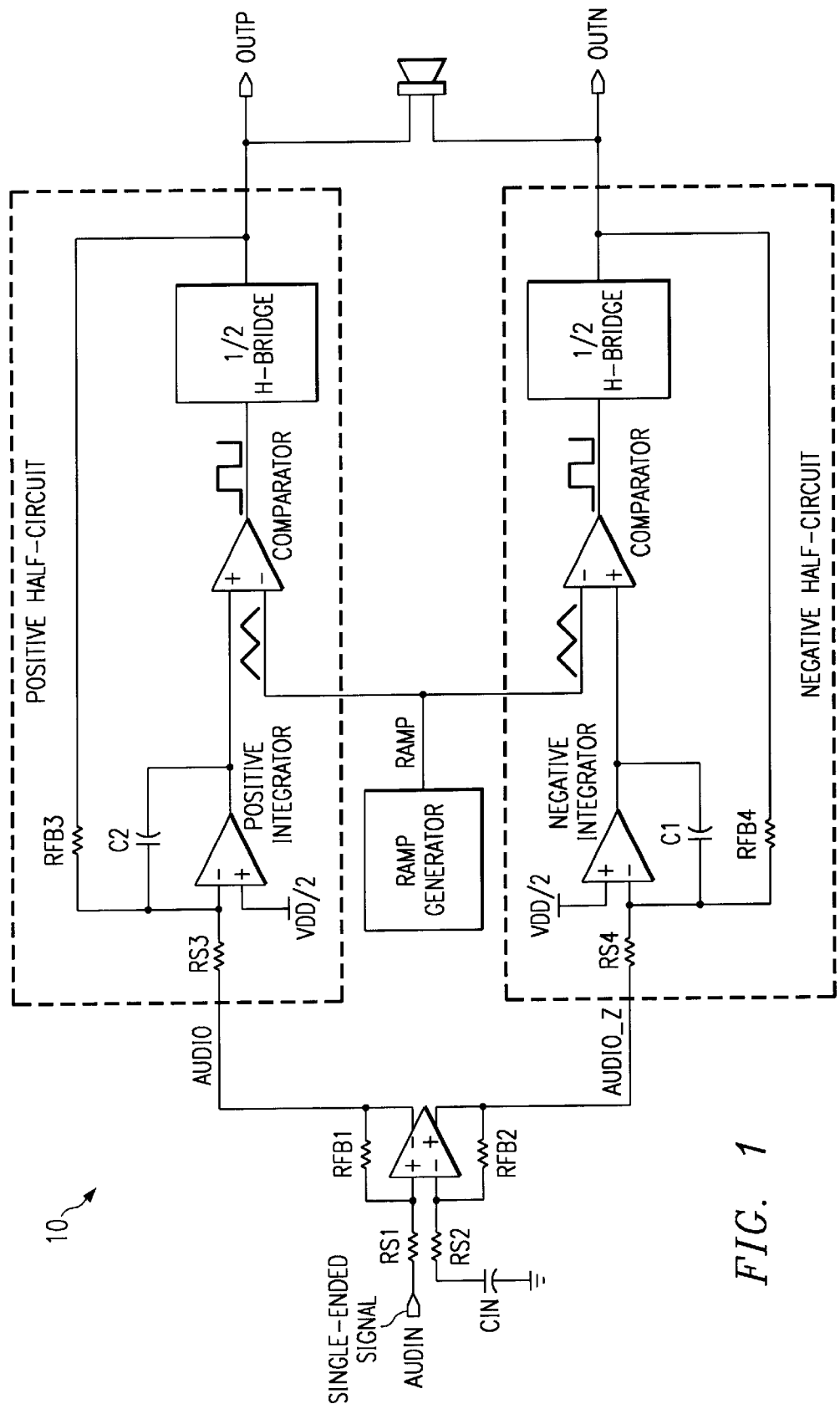
FIG. 1 is a block diagram illustrating a quaternary modulation scheme that is known in the art.
Figure 2A:
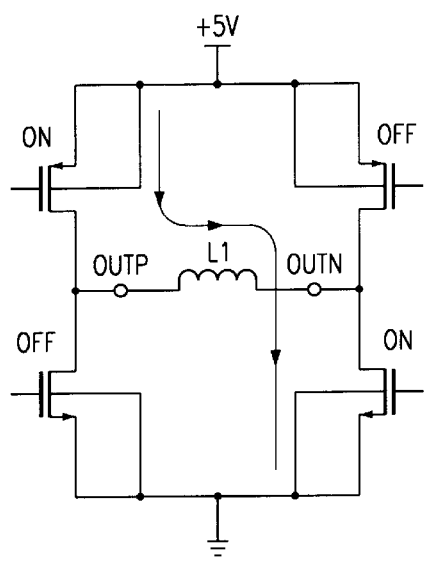
FIG. 2 is a diagram illustrating four states of operation for the quaternary modulation scheme shown in FIG. 1.
Figure 2B:
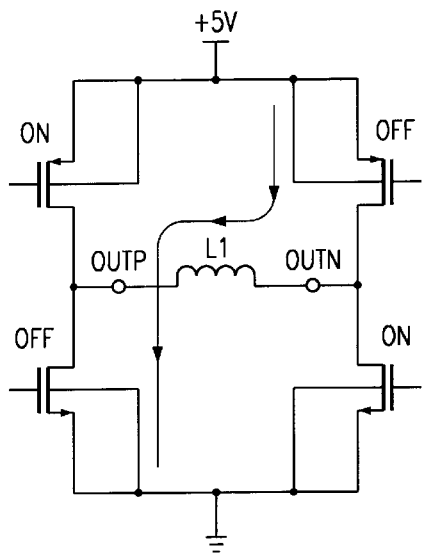
Figure 2C:
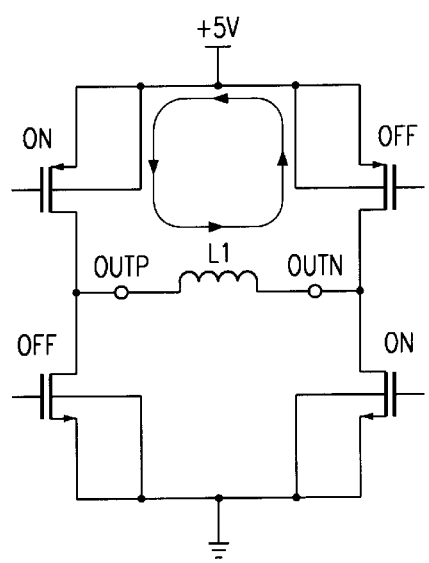
Figure 2D:
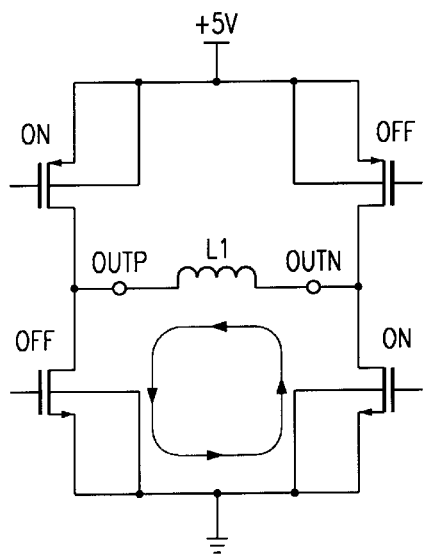
Figure 3:
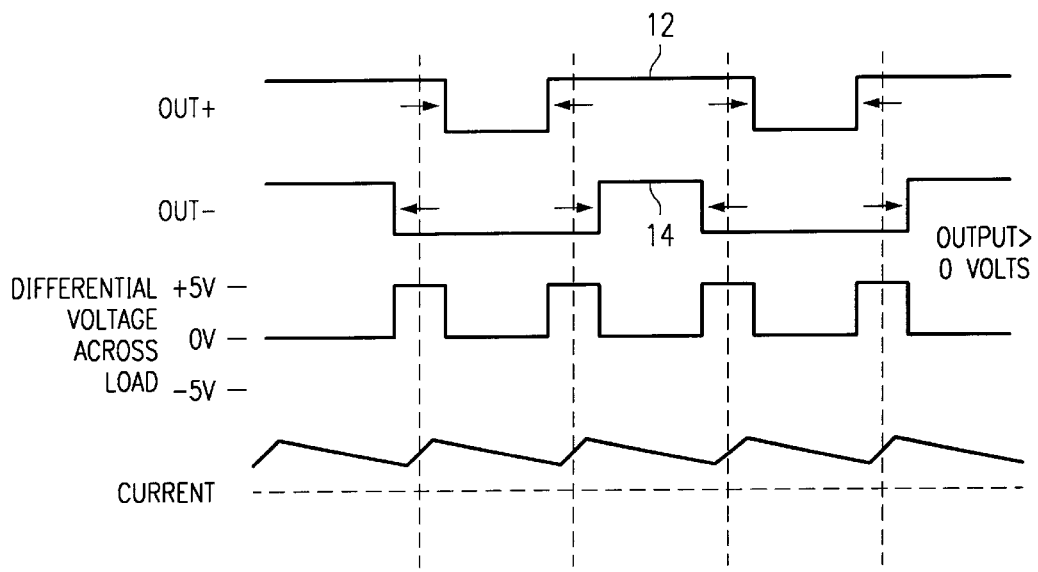
FIG. 3 is a set of waveform timing diagrams illustrating filterless class-D output voltage and current waveforms into an inductive load using the quaternary modulation scheme and states of operation shown in FIGS. 1 and 2 respectively.

The present invention is best understood by first reiterating a discussion of the well-known quaternary modulation scheme with reference to FIGS. 1–3. As stated herein before, class-D amplifiers are two to five time more efficient than class-AB amplifiers. Because of their greater efficiency, class-D amplifiers require smaller power supplies and eliminate heat sinks, significantly reducing overall system costs, size and weight. Class-D amplifiers are not in many portable products today because the traditional class-D amplifier requires an output filter, which increases size by approximately 75% and solution cost by approximately 30%. Filterless class-D amplifiers eliminate the output filter while keeping the efficiency benefit. The filterless modulation scheme brings class-D amplifiers approximately equal to class-AB amplifiers in cost and size, by has the great efficiency advantages. The THD+N of the filterless modulation scheme is better than the THD+N of equivalent class-D amplifiers with the traditional modulation scheme.

A method to achieve filterless class-D operation, increased efficiency, and reduced cost is to deliver current to the load only when needed, and once delivered, maintain the current (try not to decay or waste energy in removing the current). A quaternary modulation scheme is implemented in an H-bridge configuration. FIG. 1 is a block diagram implementation of a quaternary modulation scheme 10 that is familiar to those skilled in the art. The quaternary modulation scheme 10 shown in FIG. 1 has four states of operation as shown in FIG. 2, and voltage and current waveforms as shown in FIG. 3. The modulation scheme 10 uses any of the four states in any order, depending on the audio input signal.

When a positive audio signal is present, for example, waveforms change to that shown in FIG. 3, wherein the edges of OUTP 12 move away from each other, and the edges of OUTN 14 move towards each other. The resulting differential signal across the bridge-tied-load consists of narrow pulses with polarity determined by the polarity of the audio input signal. These narrow pulses also have a secondary desired affect of doubling the differential pulse width modulation (PWM) frequency. This then achieves the desired effect of placing current into the load only when needed, resulting in increased efficiency and less energy loss in the load (speaker).

Eliminating the filter also causes the amplifier to radiate electromagnetic interference (EMI) from the wires connecting the amplifier to the speaker. EMI is defined as the radiation or transfer of electromagnetic energy through a non-metallic medium, such as air, that interferes with the operation of other electronic devices in the vicinity. An instantaneous change in current results in a magnetic (H) field, while an instantaneous change in a voltage results in an electric (E) field, both of which may cause EMI. The electric field, which is a common-mode effect, could in fact be quite large from the switching voltage if the speaker wires are long enough. A ferrite bead filter can be added to reduce the EMI radiation at 10 MHz and higher. The cut-off frequency, however, is limited because the inductance of the ferrite bead is limited due to size constraints and the capacitor is limited because the added capacitance increases the supply current and thus decreases the efficiency. The rail-to-rail common-mode voltage at 50% duty cycle causes an increase in supply current if the output of the amplifiers see too high of a capacitance.

Figure 4:
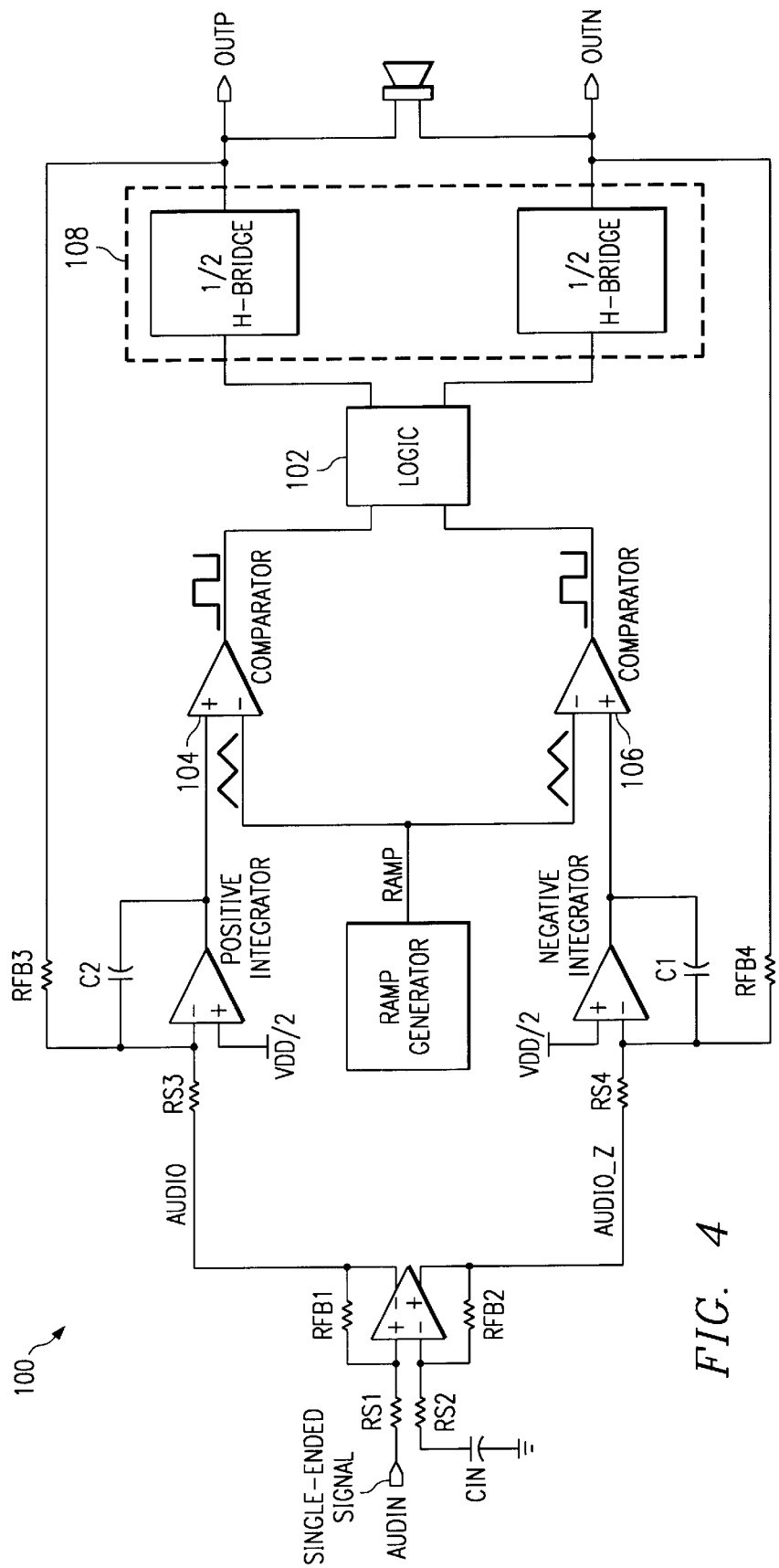
FIG. 4 is a block diagram illustrating a ternary modulation scheme according to one embodiment of the present invention.

In view of the foregoing, a need exists for a modulation scheme for filterless switching amplifiers with reduced EMI. FIG. 4 is a block diagram illustrating a ternary modulation scheme 100 for EMI reduction according to one embodiment of the present invention. This modulation scheme 100 reduces the common mode component of the audio input signal. As shown in FIG. 4, a logic block 102 is added between the output of comparators 104, 106 and H-bridge 108. This logic block 102 essentially reduces the common mode component of the audio input signal by allowing only one state with zero differential voltage across the load to exist. State 3 in FIG. 2, for example, is completely eliminated. Eliminating the common mode signal significantly reduces EMI since it reduces the electric field (E) which is responsible for EMI.

FIG. 5 is a set of waveform timing diagrams illustrating voltage waveforms for four different cases where the audio input is positive, negative and near zero crossings (going positive and negative) using the ternary modulation scheme 100 shown in FIG. 4. Case i and case ii clearly show no common mode signal in one of the logic outputs.

Figure 6A:
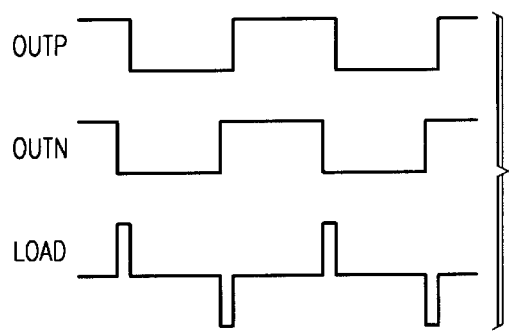
FIG. 6 is a set of waveform timing diagrams illustrating a comparison between common-mode voltage effects in ternary and quaternary modulation near zero crossings.
Figure 6B:
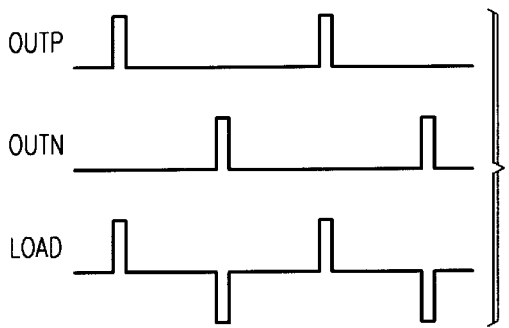

FIG. 6 is a set of waveform timing diagrams illustrating a comparison between common-mode voltage effects in ternary modulation and common-mode voltage effects in quaternary modulation near zero crossings. It can easily be seen that common-mode voltage effects using ternary modulation is significantly reduced below that generated when using quaternary modulation.

The present ternary modulation scheme provides several benefits in addition to decreasing EMI. The ternary modulation scheme can, for example, be employed in applications where EMI is very critical, such as wireless handsets as well as other portable electronics. Wireless handsets will benefit since they are very sensitive to EMI radiation and not as concerned with THD+N. Some specific applications may include, but are not limited to, class-D audio power amplifiers, digital audio, thermoelectric cooler drivers and motor control drives. Further, the ternary modulation scheme enables the user to use a smaller ferrite bead filter for the same cut-off frequency because the inductor/ferrite does not need to be very large, and the capacitor very small as in the quaternary modulation scheme. The ternary modulation scheme is more efficient than the quaternary modulation scheme, because the gates of the power MOSFETs (shown in FIG. 2) are being charged and discharged at only a small duty cycle instead of a 50% duty cycle. If using a ferrite or LC filter, the filter is smaller and less expensive with an increase in efficiency.

This invention has been described in considerable detail in order to provide those skilled in switching amplifier design with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A switching amplifier modulation circuit comprising:
a switching amplifier having a differential output; and
a logic circuit operational to allow only one signal state with zero differential voltage across a load connected to the differential output to exist such that the common mode component of the signal delivered to the load is substantially reduced below that achievable using modulation schemes that allow more than one signal state with zero differential voltage to exist across the load and further such that the common mode component reduces EMI,
wherein the switching amplifier is a filterless switching amplifier.

2. The switching amplifier modulation circuit according to claim 1 wherein the switching amplifier is a class-D switching amplifier.

3. A switching amplifier modulation circuit comprising:
a switching amplifier having a differential output; and
a logic circuit operational to allow only one signal state with zero differential voltage across a load connected to the differential output to exist such that the common mode component of the signal delivered to the load is substantially reduced below that achievable using modulation schemes that allow more than one signal state with zero differential voltage to exist across the load and further such that the common mode component reduces EMI,
wherein the switching amplifier is a class-D switching amplifier, and
wherein the class-D switching amplifier is a filterless switching amplifier.

4. A switching amplifier modulation circuit comprising:
a switching amplifier having a differential output; and
a logic circuit operational to allow only one signal state with zero differential voltage across a load connected to the differential output to exist such that the common mode component of the signal delivered to the load is substantially reduced below that achievable using modulation schemes that allow more than one signal state with zero differential voltage to exist across the load and further such that the common mode component reduces EMI,
wherein the switching amplifier is a class-D switching amplifier, and
wherein the class-D switching amplifier comprises:
a positive integrator responsive to an audio input signal to generate a positive integrator signal;
a negative integrator responsive to an audio input signal to generate a negative integrator signal;
a ramp generator operational to generate a ramp signal;
a first comparator responsive to the ramp signal and the positive integrator signal to generate a first logic signal;
a second comparator responsive to the ramp signal and the negative integrator signal to generate a second logic signal; and
an H-bridge circuit, wherein the logic circuit is responsive to the first and second logic signals to drive the H-bridge circuit such that the H-bridge circuit can generate the differential signal across the load.

5. The switching amplifier modulation circuit according to claim 1 wherein the switching amplifier is a thermoelectric cooler driver.

6. A switching amplifier modulation circuit comprising:

a logic circuit responsive to switching amplifier positive and negative logic signals generated in response to an audio input signal such that the logic circuit is operational to allow only one signal state with zero differential voltage across a load connected to a differential output associated with a switching amplifier to exist such that the common mode component of the signal delivered to the load is substantially reduced below that achievable using modulation circuits that allow more than one signal state with zero differential voltage to exist across the load and further such that the common mode component of the signal reduces EMI, and a switching amplifier operational to generate the positive and negative logic signals in response to an audio input signal, wherein the switching amplifier is a filterless switching amplifier.

7. A switching amplifier modulation circuit comprising:

a logic circuit responsive to switching amplifier positive and negative logic signals generated in response to an audio input signal such that the logic circuit is operational to allow only one signal state with zero differential voltage across a load connected to a differential output associated with a switching amplifier to exist such that the common mode component of the signal delivered to the load is substantially reduced below that achievable using modulation circuits that allow more than one signal state with zero differential voltage to exist across the load and further such that the common mode component of the signal reduces EMI, and a switching amplifier operational to generate the positive and negative logic signals in response to an audio input signal, wherein the switching amplifier is a class-D switching amplifier.

8. The switching amplifier modulation circuit according to claim 6 wherein the class-D switching amplifier is a filterless switching amplifier.

9. A switching amplifier modulation circuit comprising:

a switching amplifier having a differential output; and signal generating means for generating no more than one signal state with zero differential voltage across a load connected to the differential output to exist such that the common mode component of the signal delivered to the load is substantially reduced below that achievable using modulation circuits that allow more than one signal state with zero differential voltage to exist across the load and further such that the common mode component of the signal reduces EMI, wherein the switching amplifier is a filterless switching amplifier.

10. The switching amplifier modulation circuit according to claim 9 wherein the switching amplifier is a class-D switching amplifier.

11. A switching amplifier modulation circuit comprising:

a switching amplifier having a differential output; and signal generating means for generating no more than one signal state with zero differential voltage across a load connected to the differential output to exist such that the common mode component of the signal delivered to the load is substantially reduced below that achievable using modulation circuits that allow more than one signal state with zero differential voltage to exist across the load and further such that the common mode component of the signal reduces EMI, wherein the switching amplifier is a class-D switching amplifier, and wherein the class-D switching amplifier is a filterless switching amplifier.

12. A switching amplifier modulation circuit comprising:

a differential amplifier responsive to an audio input signal to generate a differential amplifier output signal;

a positive integrator responsive to the differential amplifier output signal to generate a positive integrator signal;

a negative integrator responsive to the differential amplifier output signal to generate a negative integrator signal;

a ramp generator operational to generate a ramp signal;

a first comparator responsive to the ramp signal and the positive integrator signal to generate a first logic signal;

a second comparator responsive to the ramp signal and the negative integrator signal to generate a second logic signal;

an H-bridge circuit having a switching amplifier differential output; and a logic circuit responsive to the first and second logic signals to drive the H-bridge circuit such that the H-bridge circuit can generate a differential signal across a load connected to the switching amplifier differential output and wherein the logic circuit is operational to allow only one signal state with zero differential voltage across the load to exist such that the common mode component of the signal delivered to the load is substantially reduced below that achievable using modulation schemes that allow more than one signal state with zero differential voltage to exist across the load and further such that the common mode component of the signal reduces EMI.

13. A method of ternary modulation for a switching amplifier comprising the steps of:

a) generating a differential signal in response to an audio input signal;

b) generating a ramp signal;

c) integrating the differential signal via a positive integrator to generate a first integrated signal;

d) integrating the differential signal via a negative integrator to generate a second integrated signal;

e) comparing the ramp signal with the first integrated signal to generate a first logic signal;

f) comparing the ramp signal with the second integrated signal to generate a second logic signal; and g) driving an H-bridge circuit via the first and second logic signals such that the H-bridge circuit can generate a differential signal across a load connected to a switching amplifier differential output and further such that the logic circuit is operational to allow no more than one signal state with zero differential voltage across the load to exist such that the common mode component of the differential signal across the load is substantially reduced below that achievable using modulation schemes that allow more than one signal state with zero differential voltage to exist across the load.

* * * * *